United States Patent
Gandhi et al.

(10) Patent No.: US 11,114,360 B1
(45) Date of Patent: Sep. 7, 2021

(54) MULTI-DIE DEVICE STRUCTURES AND METHODS

(71) Applicant: XILINX, INC., San Jose, CA (US)

(72) Inventors: Jaspreet Singh Gandhi, San Jose, CA (US); Myongseob Kim, Pleasanton, CA (US)

(73) Assignee: XILINX, INC., San Jose, CA (US)

( * ) Notice: Subject to any disclaimer, the term of this patent is extended or adjusted under 35 U.S.C. 154(b) by 170 days.

(21) Appl. No.: 16/580,620

(22) Filed: Sep. 24, 2019

(51) Int. Cl.
| | |
|---|---|
| *H01L 25/065* | (2006.01) |
| *H01L 23/31* | (2006.01) |
| *H01L 21/3065* | (2006.01) |
| *H01L 23/498* | (2006.01) |
| *H01L 21/56* | (2006.01) |

(52) U.S. Cl.
CPC ...... *H01L 23/3185* (2013.01); *H01L 21/3065* (2013.01); *H01L 21/565* (2013.01); *H01L 23/49811* (2013.01); *H01L 25/0655* (2013.01)

(58) Field of Classification Search
CPC ............. H01L 23/3185; H01L 25/0655; H01L 23/49811; H01L 21/565; H01L 21/3065
See application file for complete search history.

(56) References Cited

U.S. PATENT DOCUMENTS

| 8,963,334 | B2 | 2/2015 | Lin et al. | |
|---|---|---|---|---|
| 2019/0238134 | A1* | 8/2019 | Lee | ...................... H03K 19/1776 |
| 2020/0006288 | A1* | 1/2020 | Chen | ........................ H01L 24/82 |
| 2020/0402960 | A1* | 12/2020 | Chen | ........................ H01L 25/50 |

* cited by examiner

*Primary Examiner* — Jaehwan Oh
(74) *Attorney, Agent, or Firm* — Patterson + Sheridan, LLP

(57) ABSTRACT

Examples described herein provide techniques for multi-die device structures having improved gap uniformity between neighboring dies. In some examples, a first die and a second die are attached to an interposer. A first gap is defined by and between the first die and the second die. At least one of the first die or the second die is etched at the first gap. The etching defines a second gap defined by and between the first die and the second die. The first die, the second die, and the interposer are encapsulated with an encapsulant. The encapsulant is disposed in the second gap.

20 Claims, 5 Drawing Sheets

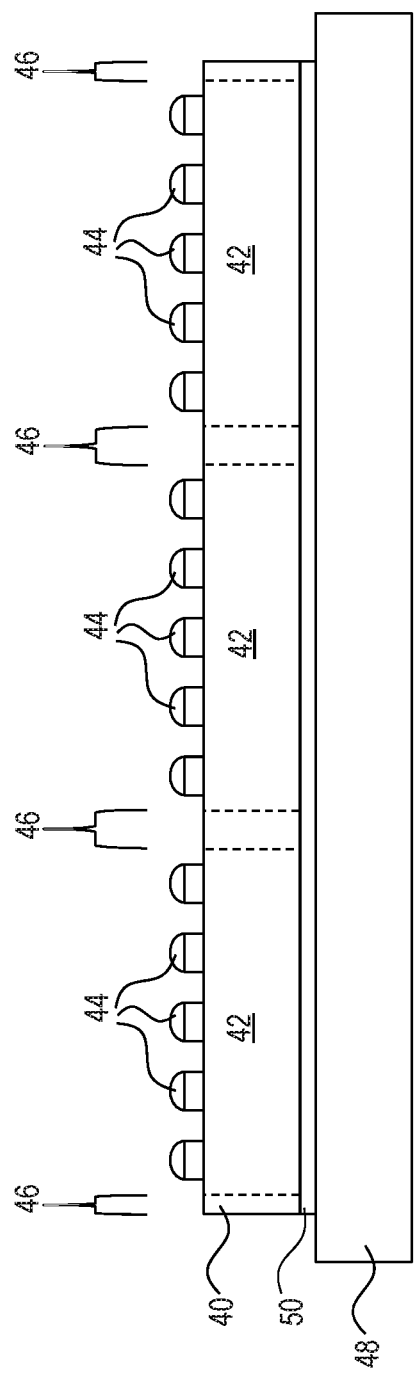
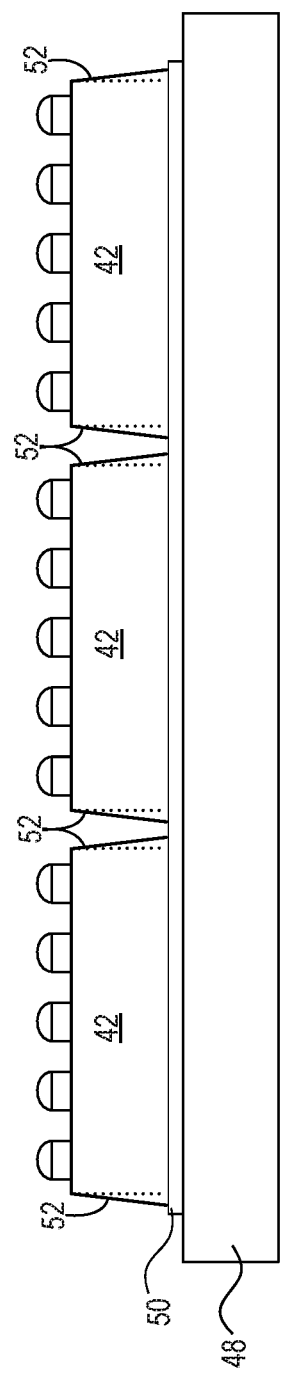

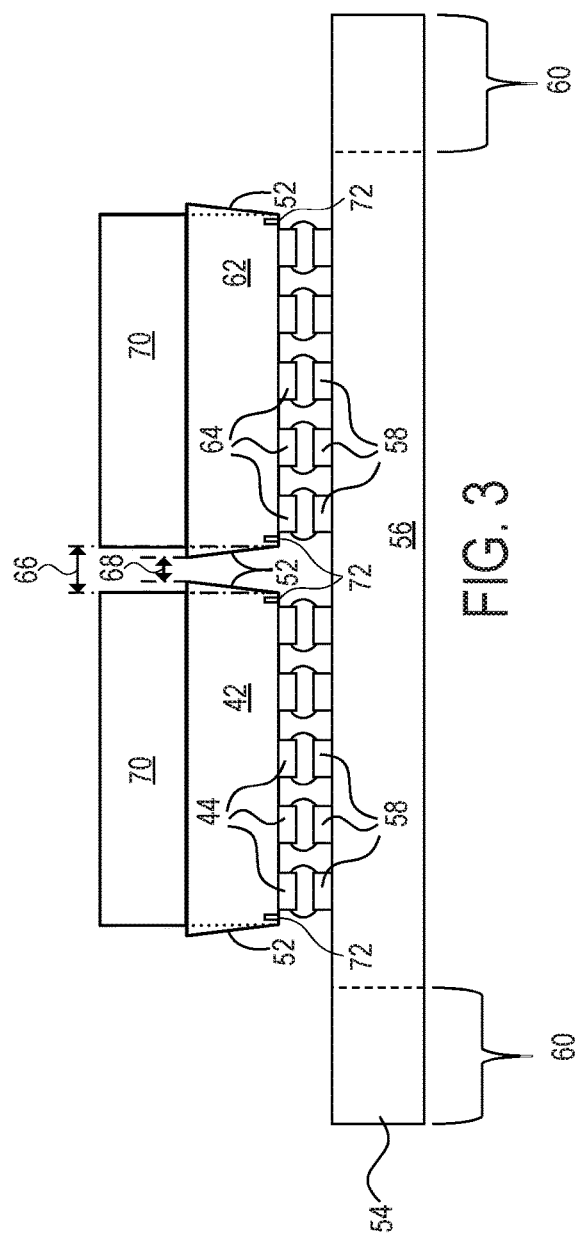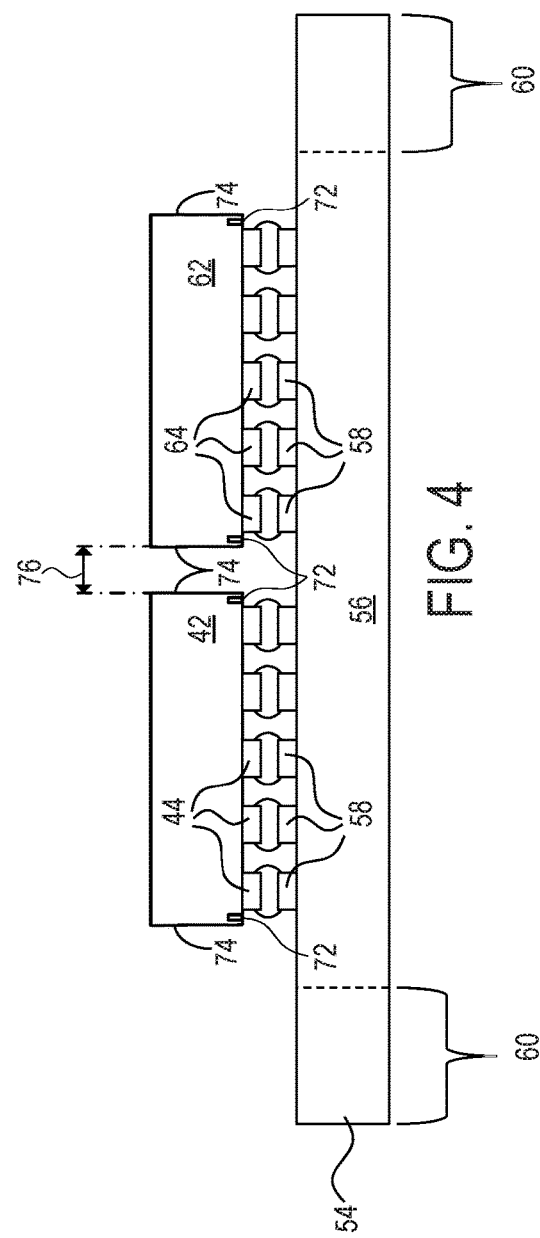

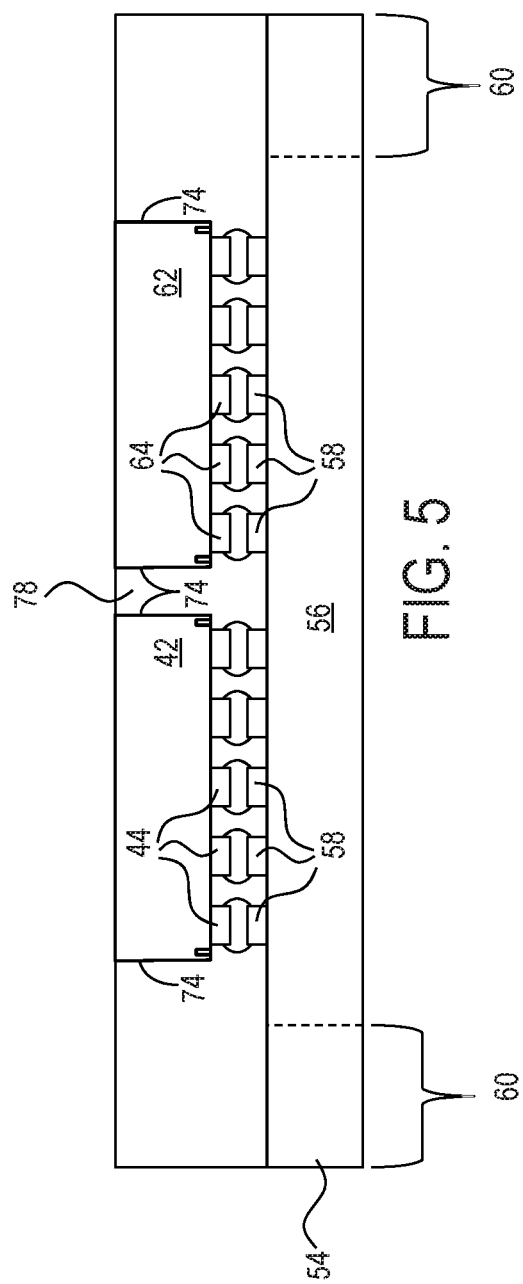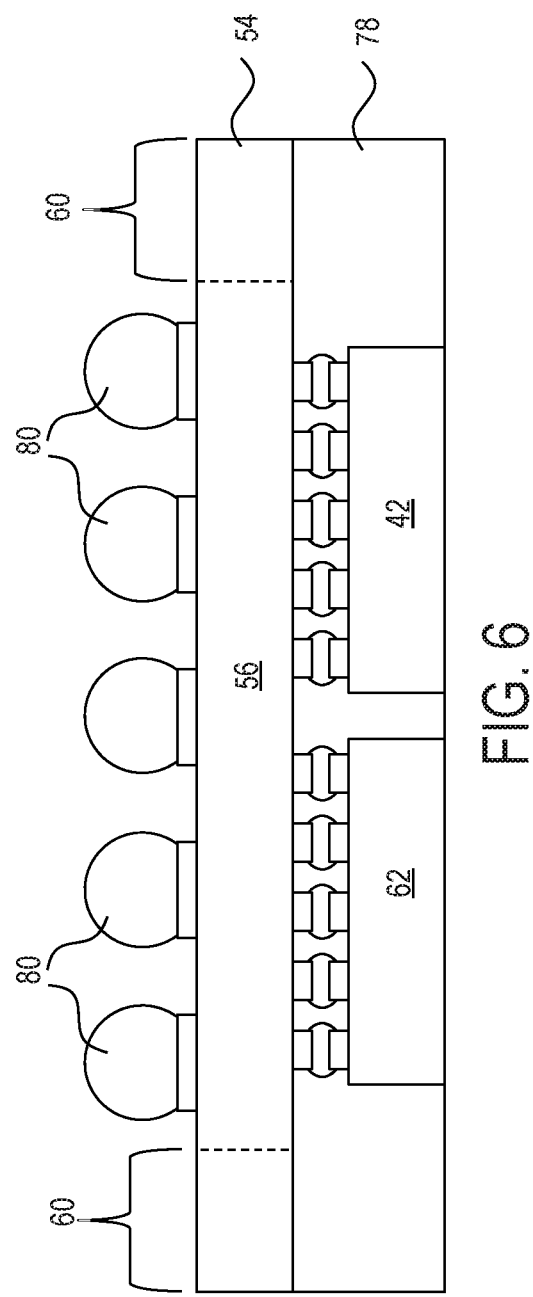

MULTI-DIE DEVICE STRUCTURES AND METHODS

TECHNICAL FIELD

Examples of the present disclosure generally relate to multi-die device structures and methods and, in particular, to multi-die device structures having improved gap uniformity between neighboring dies and methods of forming such structures.

BACKGROUND

Generally, the semiconductor processing industry has developed stacked technology where an integrated circuit formed on a die is stacked on another substrate. An example of stacked technology includes what is known as 2.5-Dimensional Integrated Circuit (2.5DIC), where one or more dies (each having an integrated circuit formed thereon) are stacked on an interposer. Another example includes what is known as 3-Dimensional Integrated Circuit (3DIC), where one or more dies (each having an integrated circuit formed thereon) are stacked on another die (that also has an integrated circuit formed thereon). In other examples, multiple levels of stacking dies with or without interposers may be implemented.

Some benefits of stacked technology can be higher density, smaller footprints, shorter electrical routing, and reduced power consumption. For example, vertical integration of dies can reduce the area used to connect the stacked dies to a package substrate. Additionally, conductive routes for electrical signals can, in some instances, include portions that are vertical to connect to another die, which can reduce the distances that electrical signals travel. The reduced distances can decrease resistance, and in turn, can decrease power consumption and propagation delay.

SUMMARY

Examples described herein provide techniques for multi-die device structures having improved gap uniformity between neighboring dies. Increased gap uniformity can increase robustness and reliability of the multi-die device structure.

An example of the present disclosure is a method for forming a multi-die structure. A first die and a second die are attached to an interposer. A first gap is defined by and between the first die and the second die. At least one of the first die or the second die is etched at the first gap. The etching defines a second gap defined by and between the first die and the second die. The first die, the second die, and the interposer are encapsulated with an encapsulant. The encapsulant is disposed in the second gap.

Another example of the present disclosure is a method for forming a multi-die structure. A first die is attached to a first die-attach area of an interposer. A second die is attached to a second die-attach area of the interposer. After attaching each of the first die and the second die to the interposer, a gap is defined between the first die and the second die. Defining the gap includes anisotropically etching at least one of the first die or the second die.

Yet another example of the present disclosure is a method for forming a multi-die structure. A first die is attached to a side of an interposer. A second die is attached to the side of the interposer. After attaching each of the first die and the second die to the interposer, a uniform gap is defined between the first die and the second die. Defining the uniform gap includes etching at least one of the first die or the second die. The first die has a first sidewall, and the second die has a second sidewall. The first sidewall and the second sidewall define the uniform gap. The first die, the second die, and the interposer are encapsulated with an encapsulant. The encapsulant is disposed in the uniform gap and adhered to the first sidewall and the second sidewall.

These and other aspects may be understood with reference to the following detailed description.

BRIEF DESCRIPTION OF THE DRAWINGS

So that the manner in which the above-recited features of various examples can be understood in detail, a more particular description of the disclosure, briefly summarized above, may be had by reference to example implementations, some of which are illustrated in the appended drawings. It is to be noted, however, that the appended drawings illustrate only typical example implementations and are therefore not to be considered limiting of its scope, for the disclosure may admit to other equally effective examples.

FIGS. 1 through 7 illustrate cross-sectional views of various structures during stages of a process for forming a multi-die device structure according to some examples.

To facilitate understanding, identical reference numerals have been used, where possible, to designate identical elements that are common to the figures. It is contemplated that elements of one example may be beneficially incorporated in other examples.

DETAILED DESCRIPTION

Figure 7:
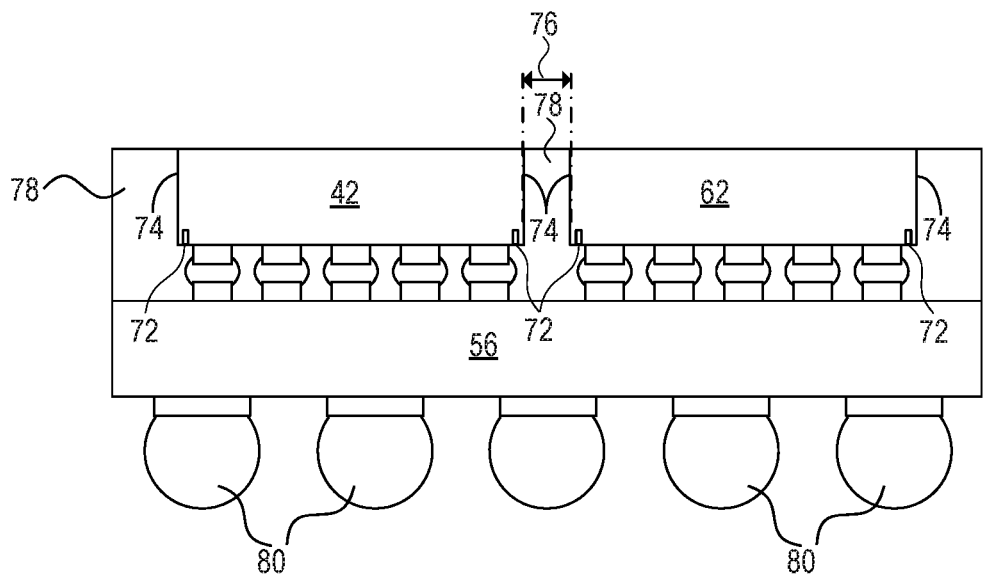

Examples described herein provide techniques for multi-die device structures having improved gap uniformity between neighboring dies. Some examples provide for performing an etching process on neighboring dies attached to an interposer to define a uniform gap between the neighboring dies. Singulation processes, such as mechanical sawing, can cause sidewalls on dies to be non-perpendicularly angled, e.g., from an active side of the respective die. When such dies are attached to an interposer, non-uniform gaps can result between neighboring dies. Non-uniform gaps can lead to reliability issues. For example, variation in widths in a gap can lead to cracks or delamination of an extra low-k dielectric (ELK) material of a die and/or a molding compound disposed in the gap resulting from thermal cycling. Some embodiments can create a uniform gap between dies attached to an interposer by performing an etching process. Hence, some examples can achieve increased reliability, among other possible advantages.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claims or as a limitation on the scope of the claims. In addition, an illustrated example need not have all the aspects or advantages shown. An aspect or an advantage described in conjunction with a particular example is not necessarily limited to that example and can be practiced in any other examples, even if not so illustrated or if not so explicitly described.

FIGS. 1 through 7 illustrate cross-sectional views of various structures during stages of a process for forming a multi-die device structure, in accordance with some examples.

FIG. 1 illustrates multiple dies 42 formed on a workpiece 40 (e.g., a wafer). The workpiece 40 can include, for example, a semiconductor wafer having any diameter, such as 100 mm, 150 mm, 200 mm, 300 mm, 450 mm, or another diameter, and having any thickness, such as 525 µm, 675 µm, 725 µm, 775 µm, 925 µm, or another thickness. Dies 42 are formed on the workpiece 40 according to a design specification. The dies 42 can include any integrated circuit, such as, for example, memory, processors, application specific integrated circuits (ASICs), programmable integrated circuits (e.g., field-programmable gate arrays (FPGAs) or complex programmable logic devices (CPLDs)), or the like. Any number of dies 42 can be formed on the workpiece 40. The workpiece 40 can be processed such that electrical connectors 44 are formed on the dies 42. The electrical connectors 44 can include microbumps, such as each having a copper pillar with solder (e.g., lead-free solder) formed thereon. In other examples, the electrical connectors 44 can be other types of electrical connectors. Scribe lines 46 are between neighboring dies 42 and along edges of dies 42 that are along an exterior of the workpiece 40. Various ones of the scribe lines 46 surround each die 42 such that by removing portions of the workpiece 40 in the scribe lines 46, each die 42 can be singulated from other dies 42. For convenience, the side of the dies 42 corresponding to the side of the semiconductor substrate (e.g., silicon wafer) on which devices, such as transistors, are formed, and in this example, the side of the dies 42 on which the electrical connectors 44 are formed, is referred to as the "front side" or "active side," whereas the side of the dies 42 opposite from the front side of the dies 42 is referred to as the "back side."

The workpiece 40 is attached to a support structure 48 for singulation of the dies 42. As illustrated, the back side of the workpiece 40 (also the back side of the dies 42) is adhered to the support structure 48 by an adhesive 50. The support structure 48 may be, for example, a glass or silicon carrier substrate or metal frame, although other support structures may be used. The adhesive 50 may be any appropriate adhesive, such as an ultraviolet (UV) tape that loses its adhesive characteristics upon exposure to UV light.

FIG. 2 illustrates the singulation of the dies 42 from the workpiece 40. Generally, the portions of the workpiece 40 along the scribe lines 46 are removed to singulate the dies 42. In some examples, a laser ablation process is performed to remove material in the scribe lines 46 to some depth, such as about 10 µm. Following the laser ablation process, a mechanical sawing process can be performed to mechanically remove material in the scribe lines 46 through the workpiece 40 to singulate the dies 42. The singulation processes (e.g., collectively) can begin by removing material from a front side of the workpiece 40 can continue through to the back side of the workpiece 40. Other singulation processes can be used, such as mechanically breaking the dies from the workpiece.

Process(es) used to singulate the dies 42 can result in sidewalls 52 of the dies 42 that are non-vertical. For example, a laser ablation process can remove a wider portion of material than sawing. Further, as examples, tolerances of the singulation process(es) (e.g., of the equipment, sawing blade, exposure, mounting, etc.) can result in the sidewalls 52 of the dies 42 being non-vertical. Further, a mechanical saw blade loading induced by the thickness of the workpiece 40 can result in the sidewalls 52 being non-vertical. In the Illustration of FIG. 2, the sidewalls 52 are non-vertical with respect to the active side of the respective dies 42 and/or are not perpendicular to the active side of the respective dies 42 (e.g., but form an obtuse angle with the active side of the respective dies 42)

FIG. 3 illustrates attaching at least one of the dies 42 to an interposer 56 formed on a workpiece 54. The workpiece 54 can include, for example, a semiconductor wafer as described above for the workpiece 40, or can include an organic substrate. In other examples, the interposer can alternatively be a die on which an integrated circuit is formed. When a die on which an integrated circuit is formed is implemented in the place of the interposer 56, the integrated circuit of the die can include, for example, memory, a processor, an ASIC, a programmable integrated circuit (IC), or the like. An interposer generally does not include active devices, such as transistors, diodes, or the like. Any number of interposers 56 can be formed on the workpiece 54.

Similar to above, the interposer 56 may be referred to as having a "front side" and a "back side," which terms do not necessarily connote any particular structure. The workpiece 54 can be processed through front-side processing such that electrical connectors 58 are formed on the interposer 56. For example, during front-side processing, through substrate vias (TSVs) may be formed at least partially through, e.g., the semiconductor wafer of the workpiece 54. The TSVs may be electrically connected to one or more redistribution metal layers on the front side of the interposer 56. The electrical connectors 58 can include microbumps, such as each having a copper pillar with or without solder (e.g., lead-free solder) formed thereon. In other examples, the electrical connectors 58 can be other types of electrical connectors. Scribe lines 60 may be disposed between neighboring interposers 56 and along edges of interposers 56 that are along an exterior of the workpiece 54.

After the dies 42 are singulated from the workpiece 40, the dies 42 can be detached from the adhesive 50, such as including exposing the adhesive 50 to UV light such that the adhesive 50 loses its adhesive characteristics. A die 42 may then be placed on a first die-attach area on the front side of the interposer 56, with the electrical connectors 44 of the die 42 contacting the electrical connectors 58 of the interposer 56 in the first die-attach area. A reflow process may be used to reflow the electrical connectors 44 to the electrical connectors 58, e.g., to reflow solder of the electrical connectors 44 and 58 together, to physically and electrically attach the die 42 to the interposer 56.

Similarly, a die 62 may be attached to a second die-attach area on the front side of the interposer 56. The die 62 can be one of the dies 42 or can be another die formed on another workpiece. The die 62 can undergo processing similar to the general process described above with respect to FIGS. 1 and 2 for the die 42. The die 62 can include any integrated circuit, such as, for example, memory, a processor, an ASIC, a programmable IC, or the like. The die 62 can include electrical connectors 64, which can include microbumps, such as each having a copper pillar with solder (e.g., lead-free solder) formed thereon. In other examples, the electrical connectors 64 can be other types of electrical connectors. After the die 62 is singulated from its workpiece, the die 62 may then be placed on a second die-attach area of the front side of the interposer 56, with the electrical connectors 64 of the die 62 contacting the electrical connectors 58 of the interposer 56 in the second die-attach area. A reflow process may be used to reflow the electrical connectors 64 to the electrical connectors 58, e.g., to reflow solder of the electrical connectors 64 and 58 together, to physically and electrically attach the die 62 to the interposer 56. The reflow process used to reflow the electrical connectors 64 and 58 together may be a same or different reflow process as the reflow process used to reflow the electrical connectors 44 and 58 together. Additional dies may be attached to the interposer 56 in other examples.

After the dies 42, 62 are attached to the interposer 56, a non-uniform gap may be present between the die 42 and the die 62, which can be a result of the sidewalls 52 of one or more of the dies 42, 62 being non-vertical. Additionally, even if sidewalls defining the gap are vertical with respect to respective active sides of the dies 42, 62, one or both of the dies 42, 62 can be attached such that a corresponding sidewall becomes non-vertical as attached to the interposer 56. For example, some of the connectors connecting a die to the interposer 56 can collapse more than others of the connectors such that the die is attached non-parallel to the interposer 56, which can result in a sidewall (even if vertical with respect to the active side of the die) being non-vertical to the front side of the interposer 56 as attached to the interposer 56 to create a non-uniform gap. In the illustrated example, the non-uniform gap has a lower width 66 (e.g., proximate to the interposer 56) and an upper width 68 (e.g., distal the interposer 56), each between a sidewall 52 of the die 42 and a sidewall 52 of the die 62. The upper width 68 is less than the lower width 66 in the illustrated example. In other examples, the lower width 66 can be less than the upper width 68.

An etch process is then performed, which may increase the uniformity of the gap between the dies 42, 62. Any appropriate etch process may be performed. In the illustrated example, a photoresist mask 70 is formed on the dies 42, 62, e.g., using photolithography. Areas of the dies 42, 62 corresponding to where any portions of the dies 42, 62 are to be removed are exposed through one or more openings through the photoresist mask 70. An anisotropic etch process can then be performed to remove the portions of the dies 42, 62. For example, the etch process can be a dry plasma process, such as a reactive ion etch (RIE) or another appropriate etch process, and can use a fluorine-based etchant, such as sulfur hexafluoride (SFe), nitrogen trifluoride ($NF_3$), tetrafluoromethane ($CF_4$), or another etchant. After the etch process, the photoresist mask 70 can be removed, such as by an asking process.

In other examples, the etch process can be a maskless process. For example, a showerhead in a chamber in which the etch process is performed can distribute an etchant in the areas where portions of the dies 42, 62 are to be removed, and a bias of a chuck supporting the interposer 56 and dies 42, 62 can cause the etchant to be anisotropically directed to those areas. In such examples, the etch process can be a dry plasma process, such as a RIE or another appropriate etch process, and can use a fluorine-based etchant, such as sulfur hexafluoride (SFe), nitrogen trifluoride ($NF_3$), tetrafluoromethane ($CF_4$), or another etchant. In other examples, an oxidizer, such as oxygen (02) and a fluorine-based etchant, such as tetrafluoromethane ($CF_4$), can be used to anisotropically oxidize the portions to be removed and to etch the oxidized portions.

Areas of the interposer 56 can be exposed to the etch process. The areas of the interposer 56, such as between the respective die-attach areas where the dies 42, 62 are attached, that are exposed to the etch process can have a passivation layer, and the etch process can be selective between the material(s) of the dies 42, 62 and the passivation layer such that the passivation layer (and hence, the interposer 56) is not significantly etched or removed.

FIG. 3 further illustrates a seal ring 72 in each of the dies 42, 62. The seal ring 72 in a die generally encircles the active circuitry of the die and is formed in the metallization layers of the die. A seal ring can reduce a likelihood that a crack or delamination in metallization layers (e.g., in ELK layers) propagates into the area of the active circuitry, as well as can reduce contaminants from reaching the area of the active circuitry. The etch process, in some examples, has tolerances less than a shortest distance of the seal ring 72 to a nearest sidewall 52 before the etch process. Hence, the etch process, in such examples, does not adversely affect the seal rings 72 in the dies 42, 62.

FIG. 4 illustrates the dies 42, 62 after the etch process. Sidewalls 74 of the dies 42, 62 are vertical, and a gap between the dies 42, 62 is uniform. In some instances, the sidewalls 74 are vertical with respect to (e.g., perpendicular to) the front side of the interposer 56. For example, the sidewalls 74 of the die 42 are perpendicular to the die-attach area of the front side of the interposer 56 to which the die 42 is attached, and the sidewalls 74 of the die 62 are perpendicular to the die-attach area of the front side of the interposer 56 to which the die 62 is attached. In some examples, if because of collapsing of solder, for example, one or both of the dies 42, 62 is attached non-parallel to the interposer 56, the sidewalls 74 may not be vertical with respect to or perpendicular to the active side of the respective die 42, 62. The gap 76 has a uniform width 76 throughout a height of the gap between the dies 42, 62. In some examples, the uniform width 76 of the gap between the neighboring, facing sidewalls 74 of the dies 42, 62 is in a range from 30 μm to 70 μm. FIG. 4 further shows the seal rings 72 in the dies 42, 62.

FIG. 5 illustrates the dies 42, 62 encapsulated on the interposer 56. An encapsulant 78 may be formed on the front side of the workpiece 54 and between the dies 42, 62. For example, the encapsulant 78 can be a molding compound or a mold underfill (MUF) which may be dispensed and molded using a vacuum-assisted mold system. In other examples, the encapsulant 78 can include multiple materials formed in different operations, such as a capillary underfill (CUF) formed using a dispense process and a molding compound subsequently formed using compression molding or another molding process. The encapsulant 78 may be formed between the die 42 and the interposer 56 around the electrical connectors 44, 58, between the die 62 and the interposer 56 around the electrical connectors 64, 58, and laterally in the uniform gap between and adhered to sidewalls 74 of the dies 42, 62.

FIG. 6 illustrates back side processing on the workpiece 54. For example, during back side processing, the TSVs may be exposed through, e.g., the semiconductor wafer of the workpiece 54 by grinding or polishing the semiconductor wafer, using; for example; a chemical mechanical polish (CMP). One or more redistribution metal layers may be formed on the back side of the interposer 56, to which the TSVs may be electrically connected. Electrical connectors 80 are formed on the back side of the interposer 56, which are also electrically connected to the one or more redistribution metal layers. The electrical connectors 80 can include controlled collapse chip connection (C4) bumps, such as each having an under bump metallization (UBM) with solder (e.g., lead-free solder) formed thereon. In other examples, the electrical connectors 80 can be other types of electrical connectors, such as ball grid array (BGA) balls.

FIG. 7 illustrates a stacked device structure after singulating the interposer 56 from the workpiece 54. The portions of the workpiece 54 and the encapsulant 78 along the scribe lines 60 may be removed by the singulation of the interposers 56. The singulation of the interposer 56 may be by using mechanical sawing, for example.

Some examples described herein can achieve increased reliability. Having a uniform gap between dies attached to an interposer can result in more uniform stresses at respective sidewalls of the dies that result from thermal cycling. A more uniform amount of molding compound can be between the sidewalls such that the stress resulting from coefficient of thermal expansion mismatch between the molding compound and the interposer can be uniformly applied to the sidewalls. This can reduce the likelihood of cracking or delamination in the dies and/or the molding compound. Further, using an etch process as described herein can be insensitive to wafer thickness, unlike loading that can occur with a mechanical saw, for example. Also, any sidewall damage that is caused by mechanical sawing during singulation of the dies can be removed by the etch process, which can increase die strength and adhesion of the molding compound to the dies.

As illustrated in the figures described by the preceding description, two dies are attached to an interposer. In other examples, more dies are attached to a side of an interposer. For example, four dies can be attached to a side of the interposer, where three dies each are or include an FPGA and one die is a memory die (or stack of dies).

Figure 8:
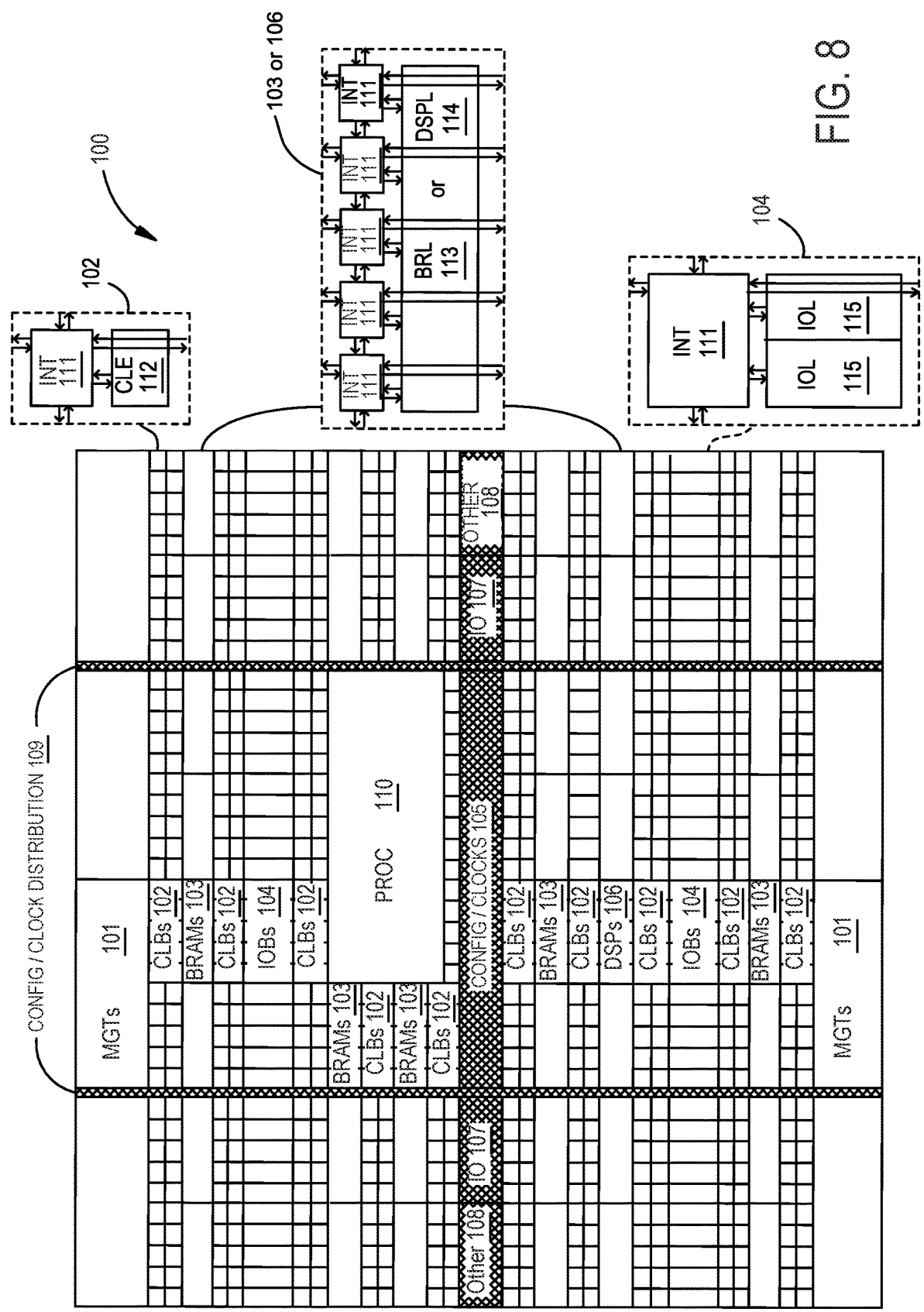
FIG. 8 illustrates a field programmable gate array (FPGA) architecture of a programmable integrated circuit according to some examples.

FIG. 8 illustrates an FPGA architecture 100 of a programmable IC according to some examples. The programmable IC can be implemented in either or both dies 42, 62 in FIGS. 1 through 7. The FPGA architecture 100 includes a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized input/output blocks (IO) 107 (e.g., configuration ports and clock ports), and other programmable logic 108 (such as digital clock managers, analog-to-digital converters, system monitoring logic, and so forth). The FPGA architecture 100 also includes dedicated processor blocks (PROC) 110.

In some FPGAs, each programmable tile includes a programmable interconnect element (INT) 111 having standardized connections to and from a corresponding interconnect element in each adjacent tile. Therefore, the programmable interconnect elements taken together implement the programmable interconnect structure for the illustrated FPGA architecture 100. The programmable interconnect element 111 also includes the connections to and from the programmable logic element within the same tile, as shown by the examples included in FIG. 8.

For example, a CLB 102 can include a configurable logic element (CLE) 112 that can be programmed to implement user logic plus a single programmable interconnect element (INT) 111. A BRAM 103 can include a BRAM logic element (BRL) 113 in addition to one or more programmable interconnect elements 111. The number of programmable interconnect elements included in a tile may depend on the height of the tile. In the pictured example, a BRAM tile has the same height as five CLBs, but other numbers (e.g., four) can also be used. A DSP tile 106 can include a DSP logic element (DSPL) 114 in addition to an appropriate number of programmable interconnect elements 111. An 10B 104 can include, for example, two instances of an input/output logic element (IOL) 115 in addition to one instance of the programmable interconnect element 111. As will be clear to those of skill in the art, the actual IO pads connected, for example, to the 10 logic element 115 typically are not confined to the area of the input/output logic element 115.

In the pictured example, a horizontal area near the center of the die (shown in FIG. 8) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 8 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 8 is intended to illustrate an example FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 8 are purely an example. For example, in an actual FPGA more than one adjacent row of CLBs is typically included wherever the CLBs appear, to facilitate the efficient implementation of user logic, but the number of adjacent CLB rows varies with the overall size of the FPGA.

Figure 9:
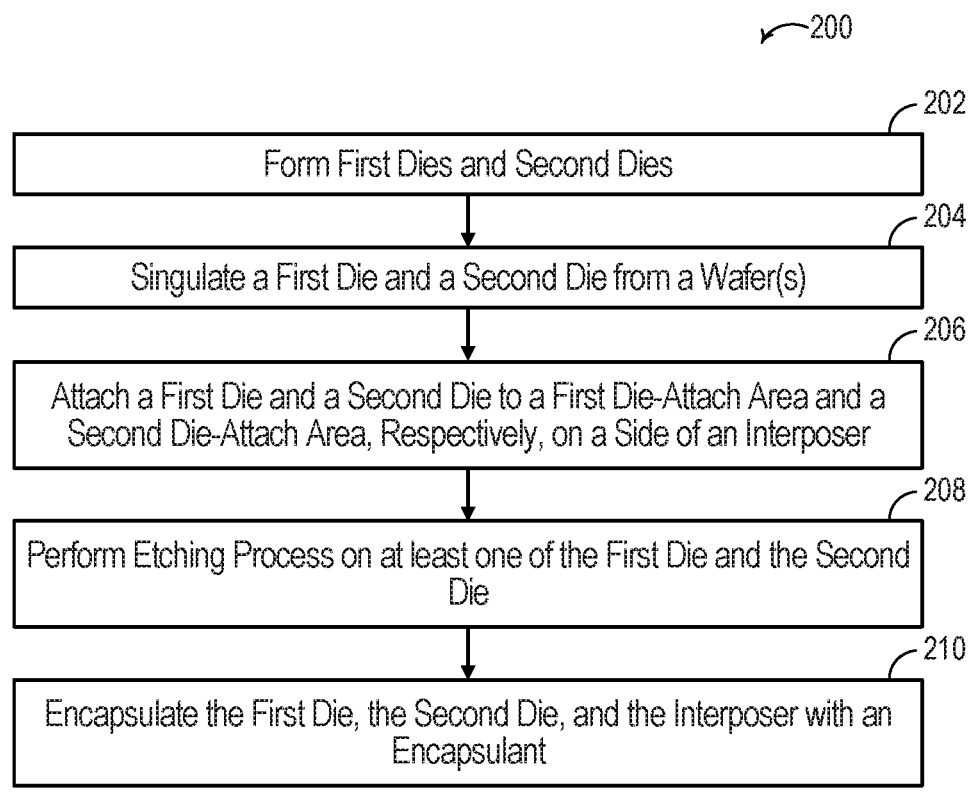
FIG. 9 is a flow chart of a method for forming a multi-die structure according to some examples.

FIG. 9 is a flow chart of a method 200 for forming a multi-die structure according to some examples. Various aspects of structures of the method 200 can be understood from the foregoing description of FIGS. 1 through 7.

At block 202, first dies and second dies are formed. The first and second dies can be formed on a same wafer or different wafers. At block 204, a first die is singulated from a respective wafer, and a second die is singulated from a respective wafer. The singulation of the first and second dies can include laser ablation, mechanical sawing, or other singulation processes. At block 206, the first die is attached to a first die-attach area on a side of an interposer, and the second die is attached to a second die-attach area on the side of the interposer. Attaching the dies to the interposer can include reflowing external electrical connectors (e.g.; including solder). When attached, a non-uniform gap may be defined between respective sidewalls of the first die and second die. For example, one or both of the neighboring, facing sidewalls of the first die and second die may be non-perpendicular to the respective first or second die-attach area of the side of the interposer to which the first and second dies are attached.

At block 208, an etching process is performed on at least one of the first die and the second die. The etching process defines a uniform gap between the first die and the second die. The etching process can form neighboring, facing sidewalls of the first die and second die to be perpendicular to the respective first or second die-attach area of the side of the interposer to which the first and second dies are attached. The etching process can define a uniform gap between the first die and the second die with a uniform width throughout a height of the uniform gap. The etching process can be an anisotropic etch process. The etch process can include using a lithography to form and pattern a photoresist mask and etching using the photoresist mask. The etch process can also include a maskless etch process.

At block 210, the first die, the second die, and the interposer are encapsulated with an encapsulant (e.g., a molding compound). The encapsulant can be adhered to the neighboring, facing sidewalls of the first and second dies that are defined, at least in part, by the etch process.

As used herein (including the claims that follow), a phrase referring to "at least one of" a list of items refers to any combination of those items, including single members. As an example, "at least one of: x, y, and z" is intended to cover: x, y, z, x-y, x-z, y-z, x-y-z, and any combination thereof (e.g., x-y-y and x-x-y-z).

While the foregoing is directed to examples of the present disclosure, other and further examples of the disclosure may be devised without departing from the basic scope thereof, and the scope thereof is determined by the claims that follow.

What is claimed is:

1. A method for forming a mufti-die structure, the method comprising:
    attaching a first die and a second die to an interposer, a first gap being defined by and between the first die and the second die;
    etching at least one of the first die or the second die at the first gap, the etching defining a second gap defined by and between the first die and the second die; and
    encapsulating the first die, the second die, and the interposer with an encapsulant, the encapsulant being disposed in the second gap.

2. The method of claim 1, wherein after the etching, the first die has a first sidewall and the second die has a second sidewall, the second gap being defined by the first sidewall and the second sidewall, the encapsulant being adhered to the first sidewall and the second sidewalk.

3. The method of claim 1, wherein after the etching, the first die has a first sidewall and the second die has a second sidewall, the second gap being defined by the first sidewall and the second sidewall, the first sidewall and the second sidewall each being perpendicular to a side of the interposer to which the first die and the second die are attached.

4. The method of claim 1, wherein after the etching, the first die has a first sidewall and the second die has a second sidewall, the second gap being defined by the first sidewall and the second sidewall, a width of the second gap between the first sidewall and the second sidewall being uniform throughout a height of the second gap.

5. The method of claim 1, wherein the etching comprises an anisotropic etch.

6. The method of claim 1 further comprising forming a photoresist on the first die and the second die, an opening being through the photoresist and exposing the first gap, the etching using the photoresist as a mask.

7. The method of claim 1, wherein the etching is a maskless etching.

8. A method for forming a multi-die structure, the method comprising:
    attaching a first die to a first die-attach area of an interposer;
    attaching a second die to a second die-attach area of the interposer; and
    after attaching each of the first die and the second die to the interposer, defining a gap between the first die and the second die comprising anisotropically etching at least one of the first die or the second die.

9. The method of claim 8 further comprising encapsulating the first die, the second die, and the interposer with an encapsulant, the encapsulant being disposed in the gap and adhered to a first sidewall of the first die and a second sidewall of the second die, the first sidewall and the second sidewall defining the gap.

10. The method of claim 8, wherein the interposer includes a passivation layer between the first die-attach area and the second die-attach area, the anisotropically etching being selective to etch the at least one of the first die or the second die and not substantially etch the passivation layer.

11. The method of claim 8 further comprising:
    before attaching the first die to the first die-attach area, singulating the first die from a wafer comprising using a mechanical saw; and
    before attaching the second die to the second die-attach area, singulating the second die from a wafer comprising using a mechanical saw.

12. The method of claim 8, wherein the gap is defined by a first sidewall of the first die and a second sidewall of the second die, the first sidewall being perpendicular to the first die-attach area of the interposer, the second sidewall being perpendicular to the second die-attach area of the interposer.

13. The method of claim 8, wherein a width of the gap is uniform throughout a height of the gap.

14. The method of claim 8, wherein further comprising forming a photoresist on the first die and the second die, an opening being through the photoresist, the anisotropically etching using the photoresist as a mask to define the gap through the opening.

15. The method of claim 8, wherein the anisotropically etching is a maskless etching.

16. A method for forming a multi-die structure, the method comprising:
    attaching a first die to a side of an interposer;
    attaching a second die to the side of the interposer;
    after attaching each of the first die and the second die to the interposer, defining a uniform gap between the first die and the second die comprising etching at least one of the first die or the second die, the first die having a first sidewall, the second die having a second sidewall, the first sidewall and the second sidewall defining the uniform gap; and
    encapsulating the first die, the second die, and the interposer with an encapsulant, the encapsulant being disposed in the uniform gap and adhered to the first sidewall and the second sidewall.

17. The method of claim 16, wherein a width of the uniform gap between the first sidewall and the second sidewall is in a range from 30 μm to 70 μm.

18. The method of claim 16, wherein the first sidewall is perpendicular to the side of the interposer, and the second sidewall is perpendicular to the side of the interposer.

19. The method of claim 16, wherein further comprising forming a photoresist on the first die and the second die, an opening being through the photoresist, the etching using the photoresist as a mask to define the uniform gap through the opening.

20. The method of claim 16, wherein the etching is a maskless etching.

* * * * *